United States Patent [19]
Yamashita

[11] Patent Number: 5,821,550
[45] Date of Patent: Oct. 13, 1998

[54] ELECTRON BEAM EXPOSURE SYSTEM

[75] Inventor: Koichi Yamashita, Tokyo, Japan

[73] Assignee: Advantest Corporation, Tokyo, Japan

[21] Appl. No.: 807,907

[22] Filed: Feb. 27, 1997

[30] Foreign Application Priority Data

Mar. 29, 1996 [JP] Japan ................................. 8-076589

[51] Int. Cl.[6] .............................................. H01J 37/302
[52] U.S. Cl. ................................................... 250/492.22
[58] Field of Search ............................ 250/492.22, 492.2

[56] References Cited

U.S. PATENT DOCUMENTS

| 5,180,920 | 1/1993 | Kai et al. ........................... 250/492.22 |
| 5,194,741 | 3/1993 | Sakamoto et al. .................. 250/492.22 |
| 5,610,406 | 3/1997 | Kai et al. ........................... 250/492.22 |

FOREIGN PATENT DOCUMENTS 1-241122   9/1989   Japan .

*Primary Examiner*—Jack I. Berman
*Attorney, Agent, or Firm*—Knobbe, Martens, Olson & Bear, LLP

[57] ABSTRACT

A pattern density for each of regions on a wafer is calculated from circuit pattern data, and a stage speed suitable for the pattern density for each of the regions is determined. An acceleration is etermined from the difference between the stage speeds for two adjacent the regions, and a higher one of the stage speeds is corrected into a lower stage speed such that the determined acceleration becomes smaller than a predetermined value. Inflection points where the stage speeds change are found. A quadratic function interconnecting adjacent two of the inflection points is determined, and the inflection points are interconnected with a curve represented by the quadratic function, thereby determining a path of movement for the stage of an electron beam exposure system. The stage is controlled to move along the path of movement thus determined.

3 Claims, 5 Drawing Sheets

ELECTRON BEAM EXPOSURE SYSTEM

BACKGROUND OF THE INVENTION

1. Field of the Invention

The present invention relates to an electron beam exposure system for use in the fabrication of semiconductor integrated circuits or the like, and more particularly to an electron beam exposure system for writing a circuit pattern on a wafer with an electron beam.

2. Description of the Related Art

Electron beam exposure systems have a movable stage that supports a workpiece, i.e., a wafer, on which a circuit pattern can be written with an electron beam while the movable stage is being moved. The speed at which the stage is moved is set by the density of the circuit pattern (hereinafter referred to as a "pattern density") which is formed on the wafer.

It is necessary to lower the speed of the stage for writing a circuit pattern at a region where the pattern density is higher. Conversely, the speed of the stage can be increased to write a circuit pattern at a region where the pattern density is lower.

In a conventional electron beam exposure system, as shown in FIG. 1 of the accompanying drawings, a stage speed is set for each frame 101 on a wafer 100 on which a circuit pattern is to be formed. In each frame 101, the stage speed is selected to match a highest pattern density in a main field 102 or a band 104 which comprises a row of subfields 103.

According to the conventional electron beam exposure system, however, any region on the wafer which has a lower pattern density and hence can be processed with a higher stage speed is required to be exposed to the electron beam at a lower stage speed which has been selected for a region of higher pattern density. As a result, the conventional electron beam exposure system has suffered a low throughput.

For increasing the throughput, there has been proposed an electron beam exposure system capable of selecting different stage speeds for respective regions on a wafer depending on pattern densities of the regions, and moving the stage at the respective different stage speeds for exposing those regions, as disclosed in Japanese laid-open patent publication No. 1-241122.

Specifically, the disclosed electron beam exposure system calculates appropriate stage speeds for respective regions having different pattern densities and moves the stage at the calculated stage speeds respectively in the regions. When the stage speed is to change greatly at an end of a region, the acceleration of the stage is limited below a certain value in order to prevent undesirable shot misalignments.

However, limiting the acceleration of the stage upon changes in the stage speed is not effective enough to prevent any burden imposed on a stage actuating mechanism by the acceleration from being unduly increased.

Specifically, if the stage speed is to change for each of small regions such as bands, then since the stage is accelerated and decelerated frequently and the acceleration is changed in a short period of time, the rate of change of the acceleration, i.e., the differential of the acceleration with respect to time, increases, resulting in a reduction in the service life of the stage actuating mechanism.

If the regions for which the respective stage speeds are established are increased in size for the purpose of reducing the frequency at which the acceleration of the stage is to change, then no significant increase in the throughput of the electron beam exposure system can be achieved.

SUMMARY OF THE INVENTION

It is therefore an object of the present invention to provide an electron beam exposure system which reduces a period of time required for exposure to achieve an increased throughput, and also reduces a burden imposed on a stage actuating mechanism due to repeated acceleration and deceleration of a stage.

To accomplish the above object, there is provided in accordance with the present invention an electron beam exposure system for writing a circuit pattern on a workpiece while moving a stage on which the workpiece is detachably mounted, comprising memory means for storing the circuit pattern, a processor for determining a path of movement for the stage using the circuit pattern stored by the memory means, and a stage control circuit for controlling the stage to move along the path of movement determined by the processor, the processor comprising means for calculating a pattern density for each of regions on the workpiece from the circuit pattern and determining a stage speed suitable for the pattern density for each of the regions, means for determining an acceleration from the difference between the stage speeds for two adjacent regions and correcting a higher one of the stage speeds into a lower stage speed such that the determined acceleration becomes smaller than a predetermined value, means for establishing a write range in which to write the circuit pattern with an electron beam for each of the regions, means for finding inflection points where the stage speeds change, means for determining a quadratic function interconnecting two adjacent inflection points and interconnecting the inflection points with a curve represented by the quadratic function, thereby determining the path of movement for the stage, and means for correcting the stage speed for any of the regions to a lower stage speed to bring the path of movement into the write range if the path of movement deviates from the write range.

Each of the regions may comprise either a main field on the workpiece or a band on the workpiece.

With the above arrangement, the processor calculates a stage speed suitable for the pattern density for each of the regions, and corrects a higher one of the stage speeds into a lower stage speed such that an acceleration upon a speed change becomes smaller than a predetermined value. The processor determines a quadratic function interconnecting two adjacent inflection points and interconnecting the inflection points with a curve represented by the quadratic function, thereby determining a path of movement for the stage. The processor operates the stage control circuit to control the stage to move along the determined path of movement. Therefore, the speed of the stage changes along curves, and the acceleration of the stage is imposed on a stage actuating mechanism as it smoothly changes over a long period of time.

The above and other objects, features, and advantages of the present invention will become apparent from the following description with references to the accompanying drawings which illustrate an example of the present invention.

DETAILED DESCRIPTION OF THE PREFERRED EMBODIMENT

Figure 2:
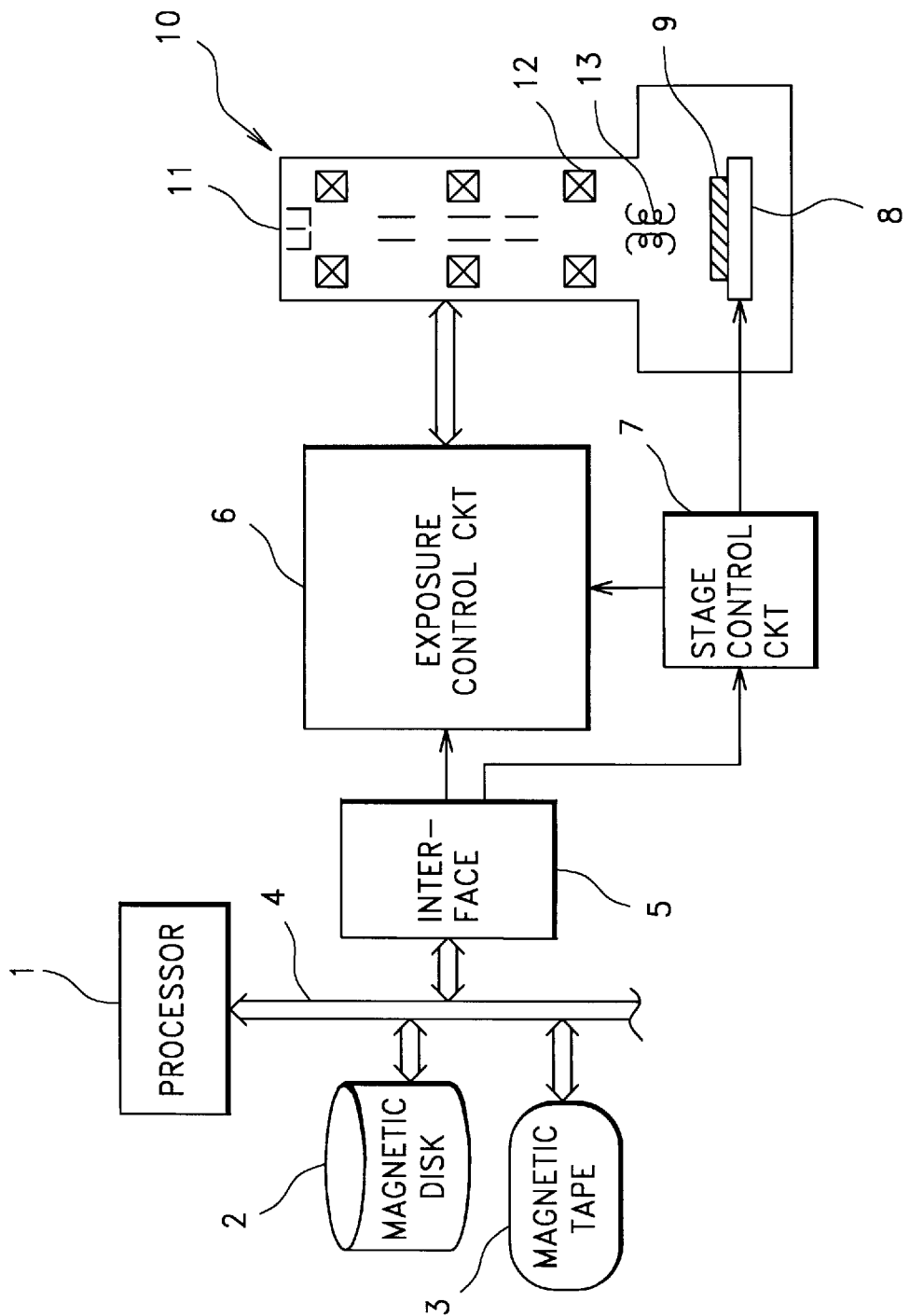
FIG. 2 is a block diagram of an electron beam exposure system according to the present invention.
Figure 3:
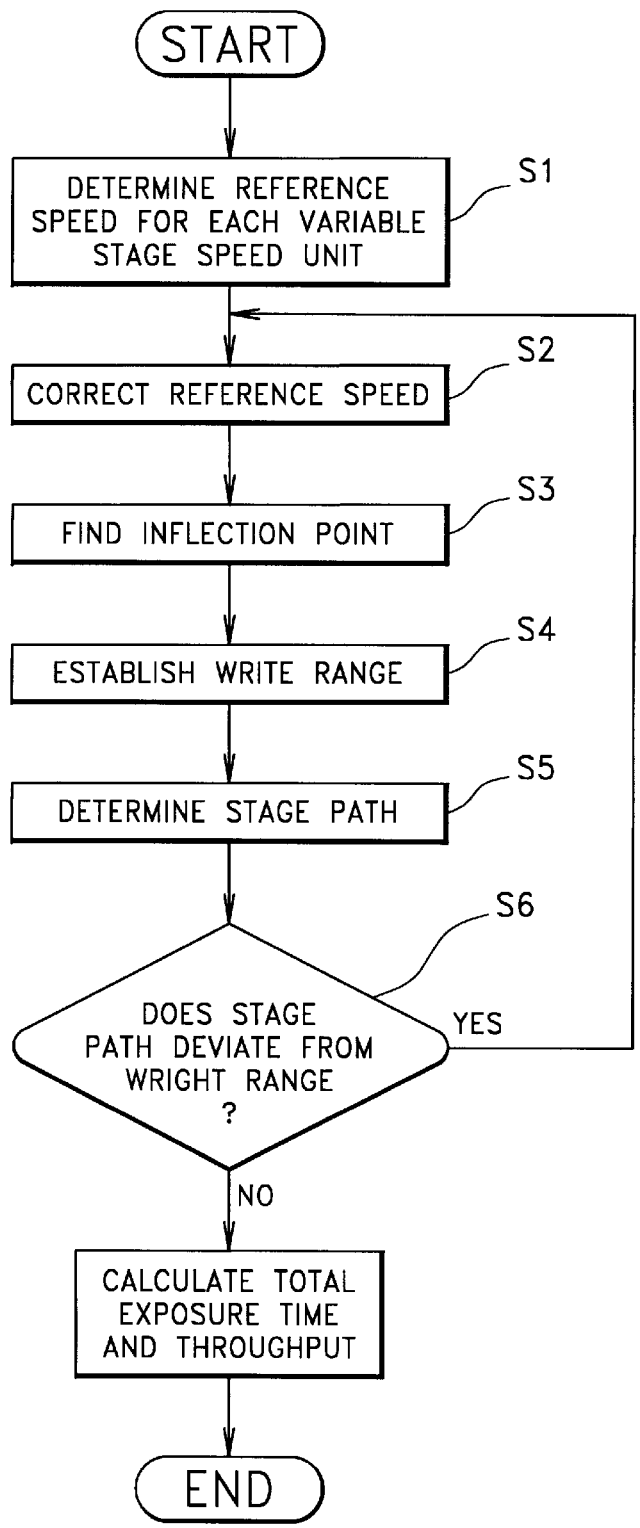
FIG. 3 is a flowchart of a process of determining the path of movement for a stage of the electron beam exposure system according to the present invention.

As shown in FIG. 2, the electron beam exposure system according to the present invention includes a column 10 comprising an electron gun 11 for emitting electrons, a main deflector 12 and an auxiliary deflector 13 for deflecting an electron beam, and a stage 8 for supporting a wafer 9 as a workpiece on which a circuit pattern is to be formed.

Electrons emitted from the electron gun 11 are shaped into an electron beam of desired shape by a plurality of deflecting units. The electron beam is then deflected by the main deflector 12 and the auxiliary deflector 13 and applied to the wafer 9 at a desired position thereon.

Magnetic and electric fields generated by the deflecting units and the main deflector 12 and the auxiliary deflector 13 are controlled by an exposure control circuit 6.

The stage 8 is controlled by a stage control circuit 7 with respect to its speed and acceleration of movement.

A magnetic disk 2 or a magnetic tape 3 stores a processing program for exposing the wafer 9 to the electron beam and also the data of a circuit pattern to be written on the wafer 9.

A processor 1 is connected to the magnetic disk 2 and the magnetic tape 3 through a bus 4, and controlled by the processing program to carry out a process necessary to expose the wafer 9 to the electron beam.

The exposure control circuit 6 and the stage control circuit 7 are connected to the processor 1 through an interface 5 and the bus 4. According to the process carried out by the processor 1, the exposure control circuit 6 controls the direction of the electron beam and the stage control circuit 7 controls movement of the stage 8.

Operation of the electron beam exposure system will be described below with reference to FIGS. 3 through 6.

The processor 1 calculates a path of movement for the stage 8 from the circuit pattern data stored in the magnetic disk 2 or the magnetic tape 3, and the stage control circuit 7 controls the stage 8 to move along the calculated path.

Figure 1:
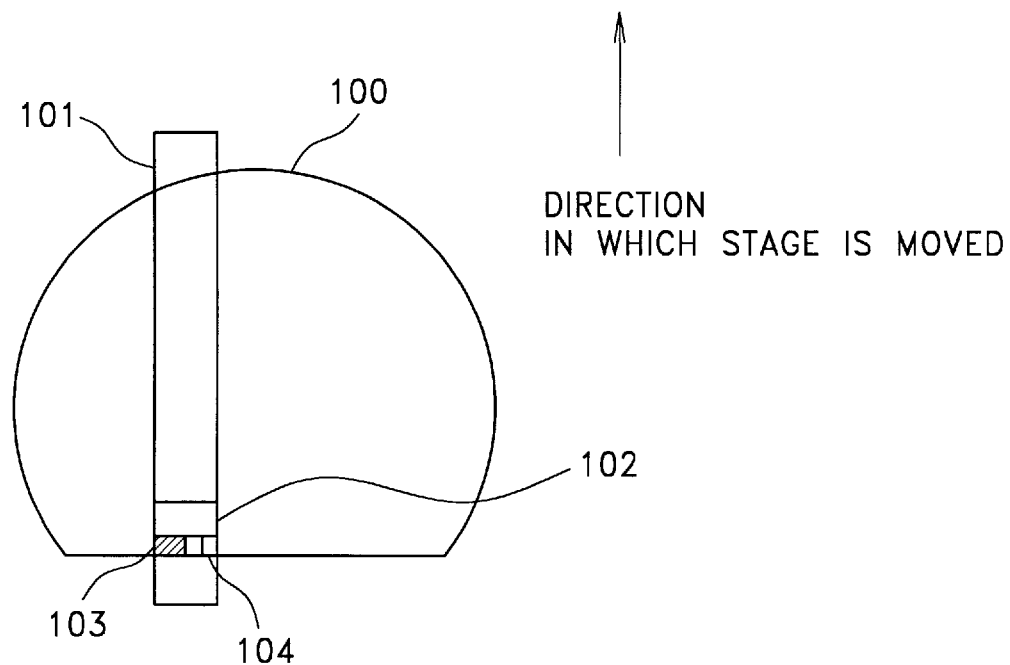
FIG. 1 is a plan view of a wafer as a workpiece on which a circuit pattern is to be written.

Specifically, the processor 1 calculates a pattern density for each of regions of the wafer 9 from the circuit pattern data stored in the magnetic disk 2 or the magnetic tape 3, and determines a stage speed (reference speed) for the stage 8 for each of the regions in a step S1. Each of the regions, i.e., a variable stage speed unit, is either a main field or a band as shown in FIG. 1.

The reasons why each of the regions is a main field are as follows:

The wafer 9 is divided into variable stage speed units as main fields to increase the throughput. Since the circuit pattern often comprises data repeated for main fields on the wafer 9, the circuit pattern data can easily be handled as repeated data for main fields.

The reasons why each of the regions is a band are as follows:

The wafer 9 is divided into smaller variable stage speed units as bands to further increase the throughput. The amount of positional correction of the electron beam with the main deflector 12 and the auxiliary deflector 13 is prevented from increasing.

To determine an exposure position on the wafer 9, the main deflector 12 first determines a rough position where the wafer 9 is to be exposed to the electron beam, and then the auxiliary deflector 13 determines an exact position where the wafer 9 is to be exposed to the electron beam. Therefore, the times required to determine an exposure position by the main deflector 12 and the auxiliary deflector 13 are different from each other, and positional correction processes carried out by the main deflector 12 and the auxiliary deflector 13 are different from each other. If each of the regions is a band, then since the size of the band and the size of a range in which the electron beam can be deflected by the auxiliary deflector 13 are equal to each other, switching between the main deflector 12 and the auxiliary deflector 13 is minimum. Therefore, the amount of positional correction of the electron beam with the main deflector 12 and the auxiliary deflector 13 does not increase.

If the variable stage speed unit is less than a band, then since the number of data of the pattern density increases, the process of calculating a pattern density for each of regions and a stage speed for the stage for each of the regions becomes time-consuming.

From the reference speeds calculated for the respective regions in the step S1, the processor 1 calculates the difference between the reference speeds for two adjacent regions, and then correct the higher reference speed into a lower reference speed in order to prevent the acceleration due to the differential speed from exceeding a predetermined allowable value in a step S2.

Figure 4:
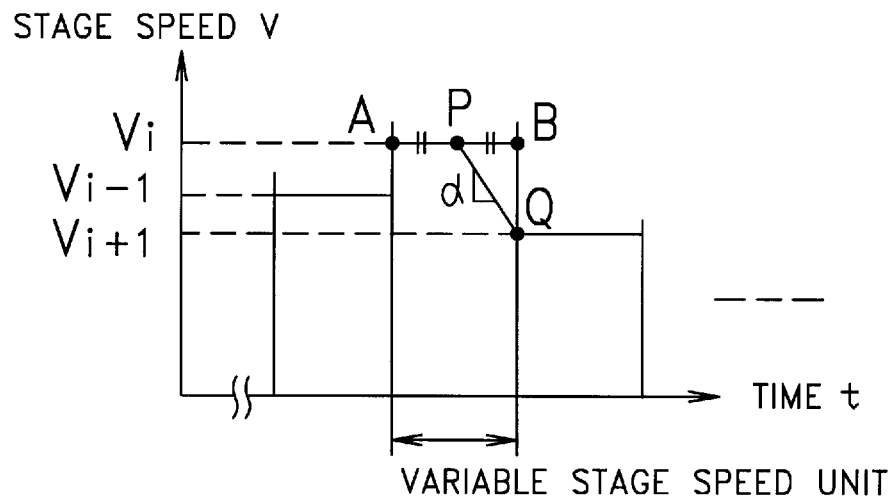
FIG. 4 is a diagram showing the manner in which the speed of the stage changes in a variable stage speed unit.

As shown in FIG. 4, the reference speed for each of the regions is defined at a middle point P of a line segment AB, and the gradient of a line segment PQ is defined as an acceleration α where Q represents a start position of a next region. If the acceleration α exceeds a predetermined value, then the higher reference speed is corrected into a lower reference speed.

According to the present invention, the lower reference speed is not corrected into a higher reference speed as it would cause problems such as a shot misalignment or the like.

Figure 5:
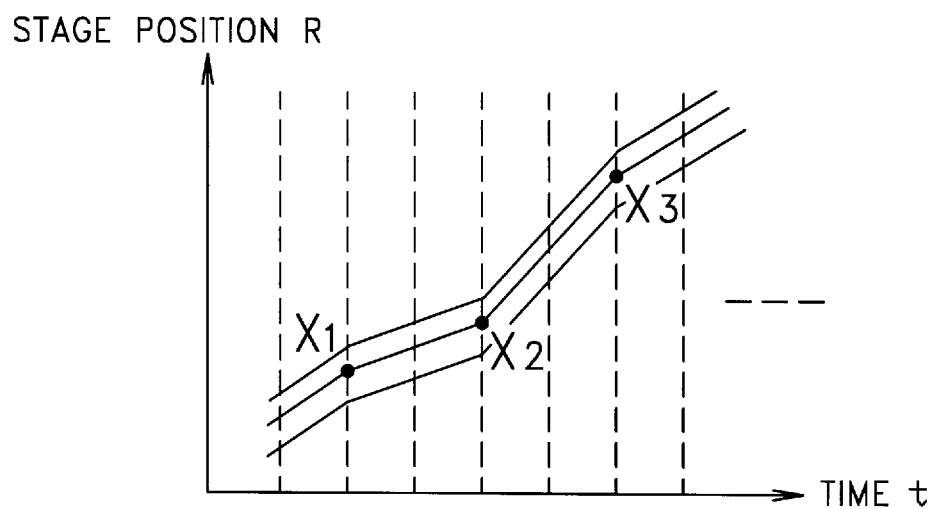
FIG. 5 is a diagram showing the manner in which the position of the stage changes before the path of the stage is determined.
Figure 6:
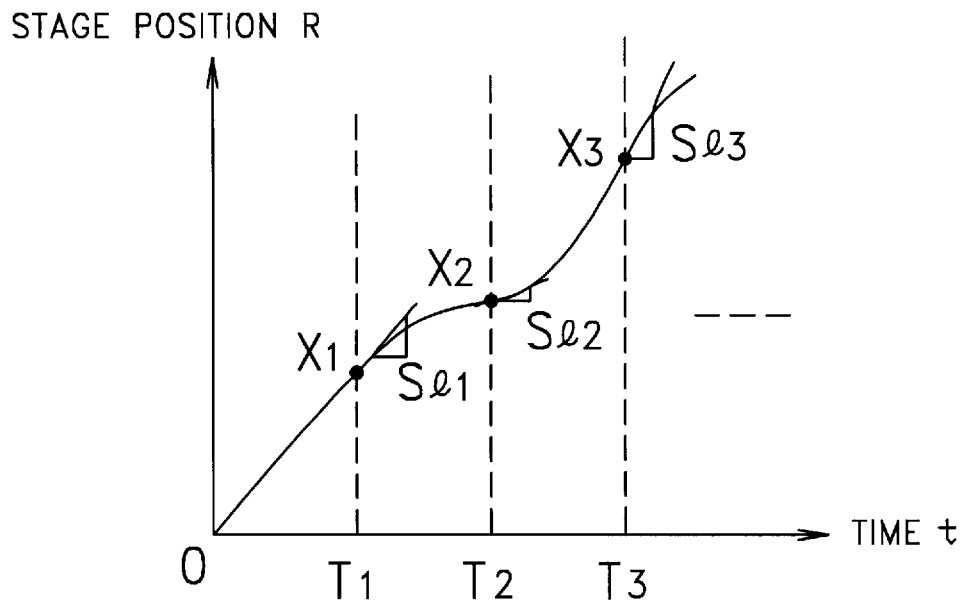
FIG. 6 is a diagram showing the manner in which the position of the stage changes after the path of the stage is determined.

Then, the processor 1 determines inflection points where the speed of the stage 8 changes from the relationship between the position R of the stage 8 and time t as shown in FIG. 5 in a step S3. In FIG. 5, the inflection points are represented by X1, X2, and X3.

Thereafter, the processor 1 determines a write range on the wafer 9 which can be exposed to the electron beam from the relationship between the position R of the stage 8 and time t as shown in FIG. 5 in a step S4. The write range is a region defined between two dot-and-dash-line curves shown in FIG. 5, and normally has a width ranging from 1.0 mm to 1.6 mm.

The processor 1 then determines a path of movement for the stage 9 in a step S5.

It is necessary for the processor 1 to determine a path of movement for the stage 9 such that it will lie within the write range at the inflection points X1, X2, aaa, Xn.

First, the origin 0 where the stage 9 starts to move and the first inflection point X1 are interconnected by a straight line.

Then, a gradient at the inflection point X1 is defined as S11, and a quadratic function interconnecting the inflection points X1, X2 is determined. The quadratic function interconnecting the inflection points X1, X2 is expressed as $R=at^2+bt+c$ (where a, b, c are arbitrary constants). The constants a, b, c are determined to meet conditions that the quadratic function passes through the two inflection points X1, X2 and the gradient at the inflection point X1 is S11.

A gradient S12 at the inflection point X2 is simultaneously determined also from the same quadratic function. A quadratic curve represented by the quadratic function thus determined is regarded as the path of movement for the stage 9 which interconnects the inflection points X1, X2.

Then, a quadratic function interconnecting the inflection points X2, X3 is determined in the same manner as the quadratic function interconnecting the inflection points X1, X2. The above process is repeated for all the regions on the wafer 9.

After the path of movement for the stage 9 for all the regions has been determined, the processor 1 checks in a step S6 whether the determined path of movement deviates from the write range determined in the step S4. If the determined path of movement does not deviate from the write range, then the processor 1 calculates a total exposure time and a throughput in a step S7. Thereafter, the process of determining the path of movement for the stage 8 is finished.

If determined path of movement deviates from the write range, then control returns to the step S2, and the processor 1 corrects the reference speed for the stage in the region into a lower reference speed in the step S2 and then repeats the steps S3~S6.

After the path of movement for the stage 9 for all the regions has correctly been determined, then the processor 1 operates the stage control circuit 7 to control the stage 8 to move along the determined path of movement.

With the present invention, because the speed of the stage 8 is changed in small regions such as main fields or bands, the throughput of the electron beam exposure system increases. When the stage 8 is accelerated or decelerated, the acceleration of the stage 8 is limited below a predetermined value. Points where the speed of the stage 8 changes are interconnected by quadratic curves, which are used as a path of movement for the stage 8. Therefore, the speed of the stage 8 changes along curves, and the acceleration of the stage 8 is imposed on the stage actuating mechanism as it smoothly changes over a long period of time. Consequently, any burden applied to the stage actuating mechanism by the acceleration is reduced.

While a preferred embodiment of the present invention has been described using specific terms, such description is for illustrative purposes only, and it is to be understood that changes and variations may be made without departing from the spirit or scope of the following claims.

What is claimed is:

1. An electron beam exposure system for writing a circuit pattern on a workpiece while moving a stage on which the workpiece is detachably mounted, comprising:

memory means for storing the circuit pattern;

a processor for determining a path of movement for the stage using the circuit pattern stored by said memory means; and a stage control circuit for controlling said stage to move along the path of movement determined by said processor;

said processor comprising:

means for calculating a pattern density for each of regions on the workpiece from said circuit pattern and determining a stage speed suitable for the pattern density for each of the regions;

means for determining an acceleration from the difference between the stage speeds for two adjacent regions and correcting a higher one of the stage speeds to a lower stage speed such that the determined acceleration becomes smaller than a predetermined value;

means for establishing a write range in which to write the circuit pattern with an electron beam for each of the regions;

means for finding inflection points where the stage speeds change;

means for determining a quadratic function interconnecting two adjacent inflection points and connecting the inflection points with a curve represented by the quadratic function, thereby determining the path of movement for the stage; and means for correcting the stage speed for any of the regions to a lower stage speed to bring said path of movement into said write range if said path of movement deviates from said write range.

2. An electron beam exposure system according to claim 1, wherein each of the regions comprises a main field on said workpiece.

3. An electron beam exposure system according to claim 1, wherein each of the regions comprises a band on said workpiece.

* * * * *

UNITED STATES PATENT AND TRADEMARK OFFICE
CERTIFICATE OF CORRECTION

PATENT NO. : 5,821,550
DATED : October 13, 1998
INVENTOR(S) : Koichi Yamashita

It is certified that error appears in the above-identified patent and that said Letters Patent is hereby corrected as shown below:

On the title page, item [75] inventors, should read--

Koichi Yamashita, Saitama-ken, Japan."

--.

Signed and Sealed this

Eighteenth Day of May, 1999

Attest:

Q. TODD DICKINSON

*Attesting Officer*    Acting Commissioner of Patents and Trademarks